United States Patent
Banine et al.

(10) Patent No.: US 8,018,578 B2
(45) Date of Patent: *Sep. 13, 2011

(54) PELLICLE, LITHOGRAPHIC APPARATUS AND DEVICE MANUFACTURING METHOD

(75) Inventors: Vadim Yevgenyevich Banine, Helmond (NL); Arno Jan Bleeker, Westerhoven (NL)

(73) Assignee: ASML Netherlands B.V., Veldhoven (NL)

( * ) Notice: Subject to any disclaimer, the term of this patent is extended or adjusted under 35 U.S.C. 154(b) by 500 days.

This patent is subject to a terminal disclaimer.

(21) Appl. No.: 11/785,744

(22) Filed: Apr. 19, 2007

(65) Prior Publication Data

US 2008/0259291 A1  Oct. 23, 2008

(51) Int. Cl.
*F21V 9/04* (2006.01)
*F21V 9/06* (2006.01)
*G02B 5/20* (2006.01)
*G03B 27/32* (2006.01)
*G03B 27/42* (2006.01)
*G03B 27/52* (2006.01)
*G03B 27/54* (2006.01)

(52) U.S. Cl. ........... 355/71; 252/588; 355/30; 355/53; 355/67; 355/77; 359/359; 359/361

(58) Field of Classification Search ........... 355/30, 355/53, 77, 67, 71, 75; 359/359–361; 252/588–589; 430/5; 250/492.2
See application file for complete search history.

(56) References Cited

U.S. PATENT DOCUMENTS

| | | | |
|---|---|---|---|
| 6,498,685 B1 * | 12/2002 | Johnson | 359/626 |
| 6,623,893 B1 | 9/2003 | Levinson et al. | |
| 6,833,903 B2 * | 12/2004 | Kamono | 355/30 |
| 7,372,623 B2 * | 5/2008 | Banine et al. | 359/360 |
| 7,639,418 B2 * | 12/2009 | Banine et al. | 359/360 |
| 7,666,555 B2 * | 2/2010 | Goldstein et al. | 430/5 |
| 2004/0061930 A1 * | 4/2004 | Wedowski | 359/359 |
| 2005/0040345 A1 * | 2/2005 | Bakker et al. | 250/492.2 |
| 2005/0042153 A1 * | 2/2005 | Bristol et al. | 422/186.3 |
| 2005/0242300 A1 | 11/2005 | Silverman | |
| 2006/0221440 A1 | 10/2006 | Banine et al. | |
| 2006/0245044 A1 * | 11/2006 | Apetz et al. | 359/359 |
| 2007/0190433 A1 | 8/2007 | Hirayanagi | |
| 2008/0113491 A1 * | 5/2008 | Wood et al. | 438/460 |
| 2009/0159808 A1 * | 6/2009 | Bowering et al. | 250/372 |

FOREIGN PATENT DOCUMENTS

JP  2008268956 A  * 11/2008
WO  WO 2005017624 A1  * 2/2005

OTHER PUBLICATIONS

Luxel Corporation, "Filter Support for Strength and Durability", http://www.luxel.com, Dec. 2006.

* cited by examiner

*Primary Examiner* — Hung Henry Nguyen
*Assistant Examiner* — Colin Kreutzer
(74) *Attorney, Agent, or Firm* — Pillsbury Winthrop Shaw Pittman LLP

(57) ABSTRACT

A pellicle for integrated circuit equipment operating in an EUV range includes a multi-layered structure of alternating layers. The pellicle is constructed and arranged to reflect or absorb undesired radiation and to intercept debris to enhance the spectral purity of a radiation beam.

29 Claims, 6 Drawing Sheets

PELLICLE, LITHOGRAPHIC APPARATUS AND DEVICE MANUFACTURING METHOD

FIELD

The present invention relates to a pellicle, a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged on the substrate is limited by wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation in the range of about 5 nm to about 20 nm, especially around 13 nm. Such radiation is termed extreme ultraviolet (EUV) or soft X-ray and suitable sources include, for example, laser-produced plasma sources, discharge plasma sources or synchrotron radiation from electron storage rings.

In conventional ultra-violet lithography, a patterning device is typically protected from a debris with a suitable pellicle arranged in a direct vicinity of the patterning device.

EUV radiation sources, such as discharge plasma radiation sources referred to above, may operate with a relatively high partial pressure of a gas or vapor to emit EUV radiation. In a discharge plasma source, for example, a discharge is created in between electrodes, and a resulting partially ionized plasma may subsequently be caused to collapse to yield a very hot plasma that emits radiation in the EUV range. The very hot plasma Xe is used as gas in the plasma. since a Xe plasma radiates in the extreme UV (EUV) range around 13.5 nm. For an efficient EUV production, a typical pressure of 0.1 mbar is used near the electrodes to the radiation source. A drawback of having such a rather high Xe pressure is that Xe gas absorbs EUV radiation. For example, 0.1 mbar Xe transmits over 1 m only 0.3% EUV radiation having a wavelength of 13.5 nm. It is therefore desirable to confine the rather high Xe pressure to a limited region around the source. To achieve this, the source can be contained in its own vacuum chamber in which the collector mirror and illumination optics may also be contained.

The known pellicle used for ultraviolet applications may not be suitable for EUV range.

SUMMARY OF THE INVENTION

It is an aspect of the invention to provide a lithographic apparatus operating in EUV range with a pellicle having a substantial transmission for wavelengths lying in EUV range.

According to an aspect of the invention there is provided a pellicle for integrated circuit equipment operating in an EUV range includes a multi-layered structure of alternating layers. The pellicle is constructed and arranged to reflect or absorb undesired radiation and to intercept debris to enhance the spectral purity of a radiation beam.

According to an aspect of the invention, there is provided an assembly comprising a patterning device and a pellicle for integrated circuit equipment operating in an EUV range includes a multi-layered structure of alternating layers. The pellicle is constructed and arranged to reflect or absorb undesired radiation and to intercept debris to enhance the spectral purity of a radiation beam.

According to an aspect of the invention there is provided a lithographic apparatus for maskless EUV applications. The apparatus comprises an illumination system constructed and arranged to condition a radiation beam emanating from a source of radiation and to supply the conditioned radiation beam to a spatial light modulator for patterning the radiation beam, a substrate table constructed and arranged to hold a substrate, a projection system constructed and arranged to project the conditioned radiation beam onto a target portion of the substrate, and a pellicle constructed and arranged between the illumination module and the spatial light modulator. The pellicle comprises a multi-layered structure of alternating layers. The pellicle is constructed and arranged to reflect or absorb undesired radiation and to intercept debris to enhance the spectral purity of the radiation beam.

According to an aspect of the invention, there is provided a lithographic apparatus comprising an illumination system constructed and arranged to condition a radiation beam, and a support constructed and arranged to support a patterning device. The patterning device is capable of imparting the radiation beam with a pattern in its cross-section to form a patterned radiation beam, and the support is displaceably arranged. The apparatus also includes a substrate table constructed and arranged to hold a substrate, a projection system constructed and arranged to project the patterned radiation beam onto a target portion of the substrate, and a pellicle. The pellicle comprises a multi-layered structure of alternating layers, and is constructed and arranged to reflect or absorb undesired radiation and to intercept debris to enhance the spectral purity of the radiation beam.

According to an aspect of the invention, there is provided a device manufacturing method comprising intercepting a beam of EUV radiation with a pellicle, enhancing the spectral purity of the beam of EUV radiation with the pellicle by reflecting or absorbing undesired radiation and intercepting debris, patterning the beam of EUV radiation with a patterning device, and projecting the patterned beam of EUV radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
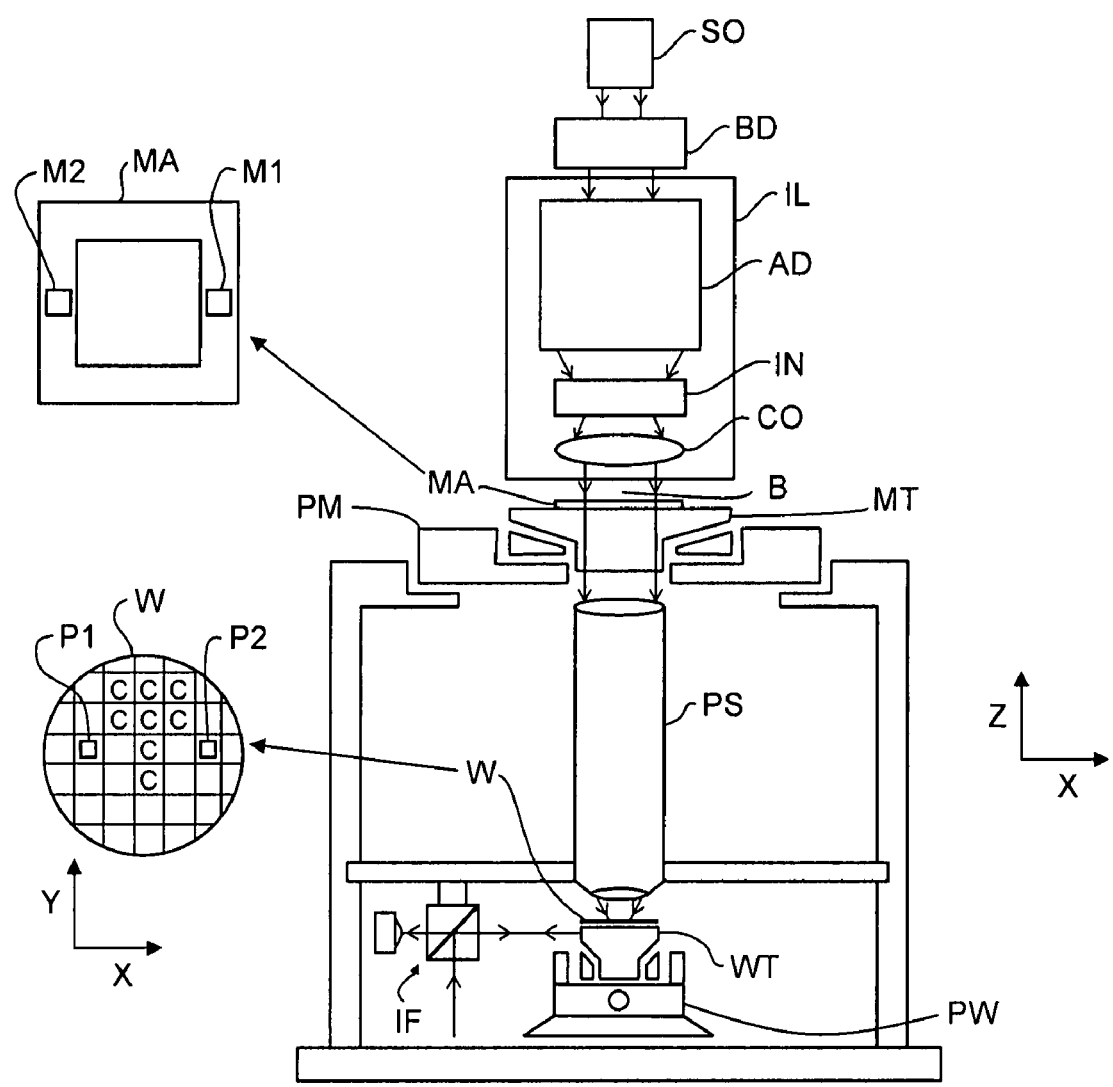
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B, notably Extreme Ultra Violet (EUV) radiation; a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases, the source may be an integral part of the lithographic apparatus, for example when the source is a mercury lamp. The source SO and the illuminator IL, together with the beam delivery system BD if desired, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear-encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM.

Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
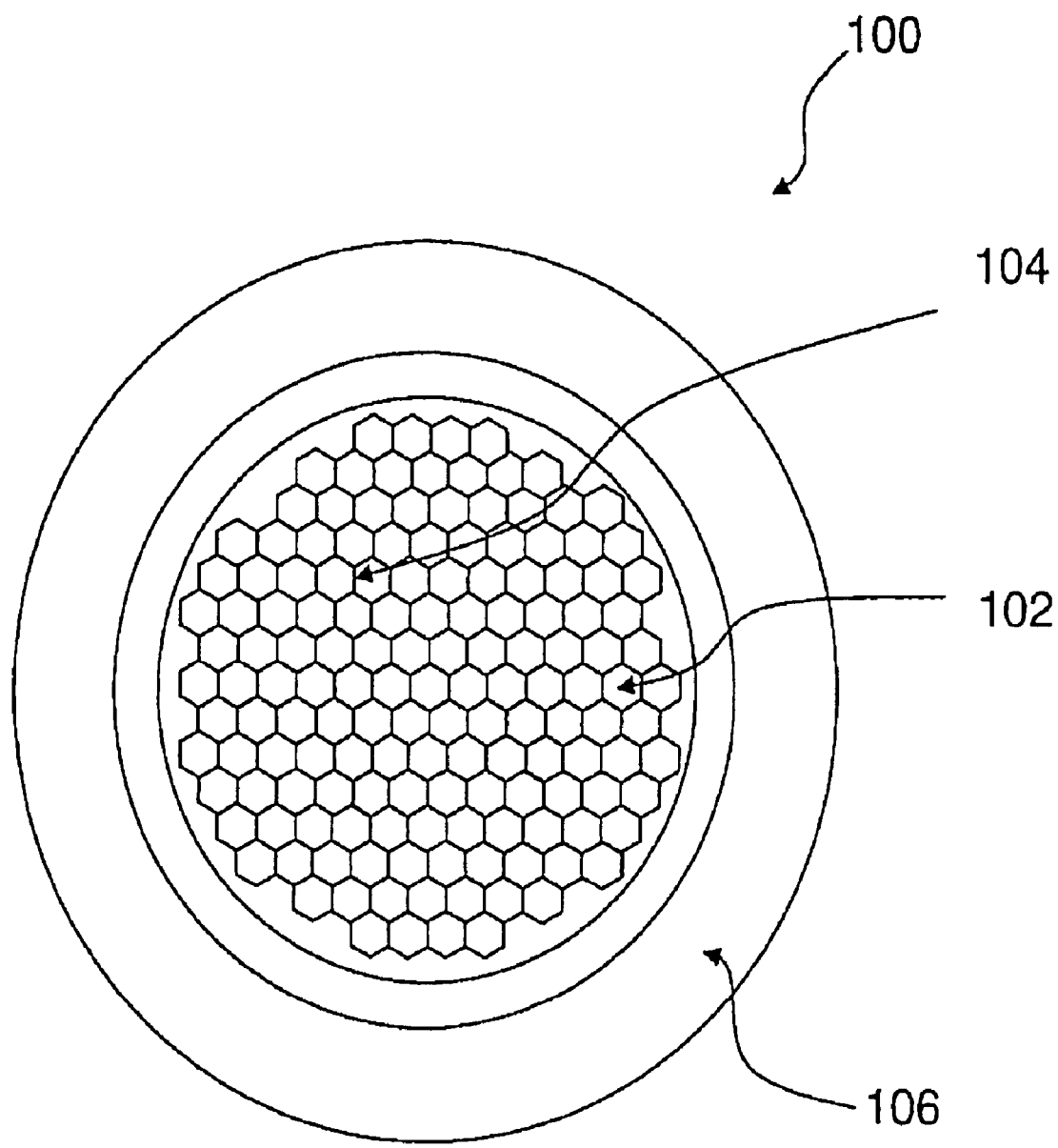
FIG. 2 schematically depicts a pellicle according to an embodiment of the present invention.

FIG. 2 schematically depicts a pellicle 100 according to an embodiment of the present invention. The pellicle 100 has a multi-layered structure formed by a plurality, for example about 50, alternating Zr/Si layers 102. Alternative embodiments may have between about 2 and about 200 alternating Zr—Si layers 102.

The pellicle 100 may also include a mesh 104. The mesh 104 may be made from a suitable metal, for example Cu, and may form a honeycomb structure that includes substantially hexagonal shaped apertures, each having a size of about 1-1.5 mm$^2$. The mesh 104 penetrates from one side to the other side of the alternating Zr/Si layers 102. In alternative embodiments, meshes 104 may be placed adjacent to one side only or on both sides of the Zr/Si layers 102, or may partially penetrate into the Zr/Si layers 102.

The mesh 104 enhances the integral strength of the Zr/Si layers 102. The Zr/Si layers 102 are mounted in a substantially circular shaped base 106. The shape of the base 106 may facilitate the incorporation of the pellicle 100 into a lithographic apparatus, notably by forming an assembly with a patterning device (not shown). The pellicle 100 is therefore easy to handle. Alternatively, the base may have a rectangular shape. The illustrated embodiment is not intended to be limiting in any way. The pellicle may be mounted to a reticle having the same circular or rectangular shape.

The Zr/Si layers 102 are designed to be substantially robust. For example, Zr/Si layers 102 are shown in FIG. 2 with a mesh and with a total thickness of about 200 nm and a surface area of about 10 cm can withstand pressure differences up to about 0.5-1 bar.

Figure 3:
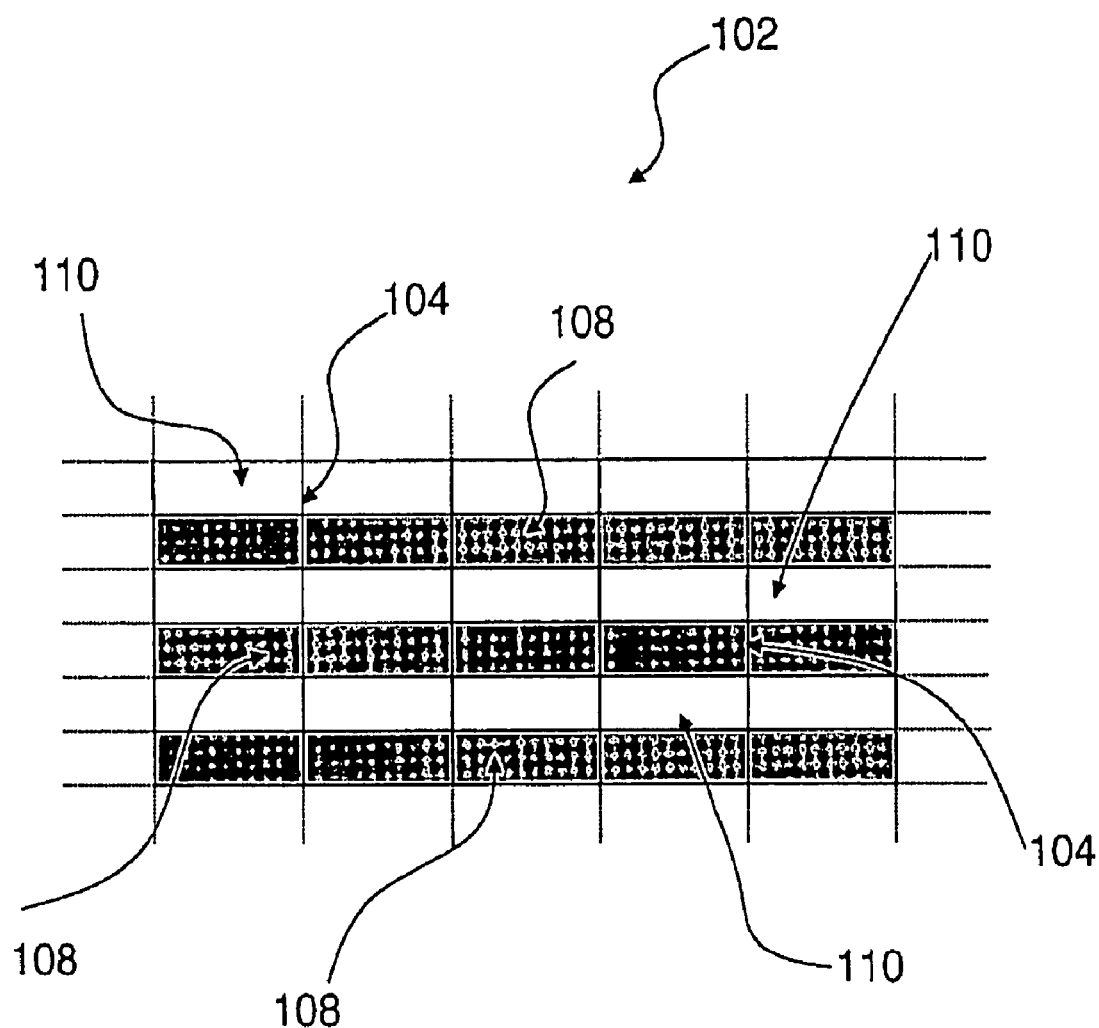
FIG. 3 schematically depicts a cross-section of part of the pellicle shown in FIG. 2.

FIG. 3 schematically depicts a cross-section of a part of the pellicle 100 shown in FIG. 2. In FIG. 3 the thickness of the Zr layers 108 is about 1 nm and the thickness of the Si layers 110 is about 3 nm. FIG. 3 shows the mesh 104 extending through the Zr/Si layers 102. In alternative embodiments, although not shown, the thickness of the Zr/Si layers 102 may be variable. Although not fully shown in FIG. 3, there may be about 50 or more alternating layers of Zr and Si.

Figure 4:
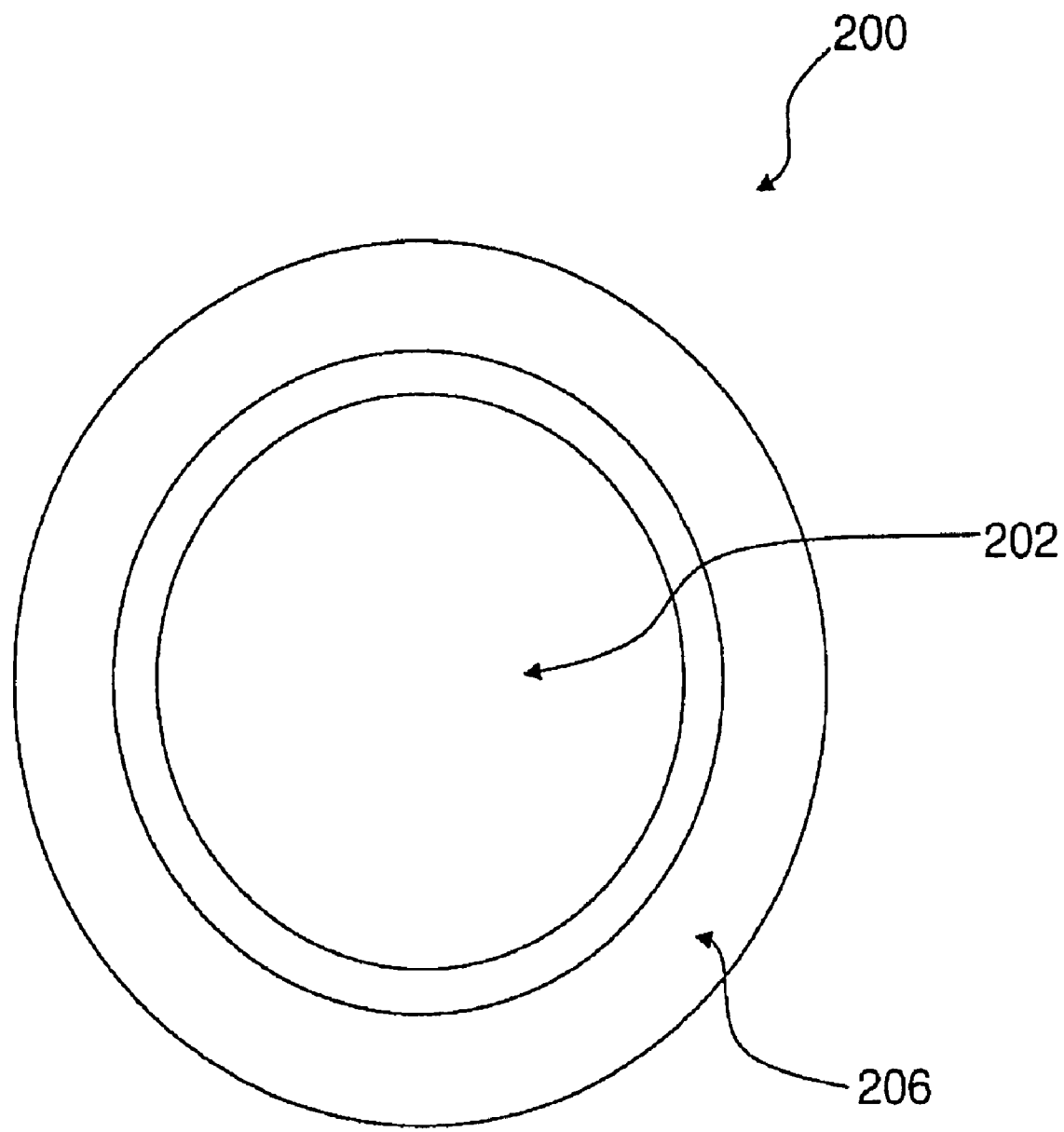
FIG. 4 schematically depicts a pellicle according to another embodiment of the present invention.

FIG. 4 schematically depicts a pellicle 200 according to another embodiment of the present invention. A multi-layer structure formed by alternating Zr/Si layers 202 are not as strong as the Zr/Si layers 102. For example, Zr/Si layers 202 with a total thickness of about 200 nm and a surface area of about 10 cm can withstand pressure differences of only about 0.1 mbar. The multi-layer structure may be mounted in a base 206, as shown in FIG. 4.

Figure 5:
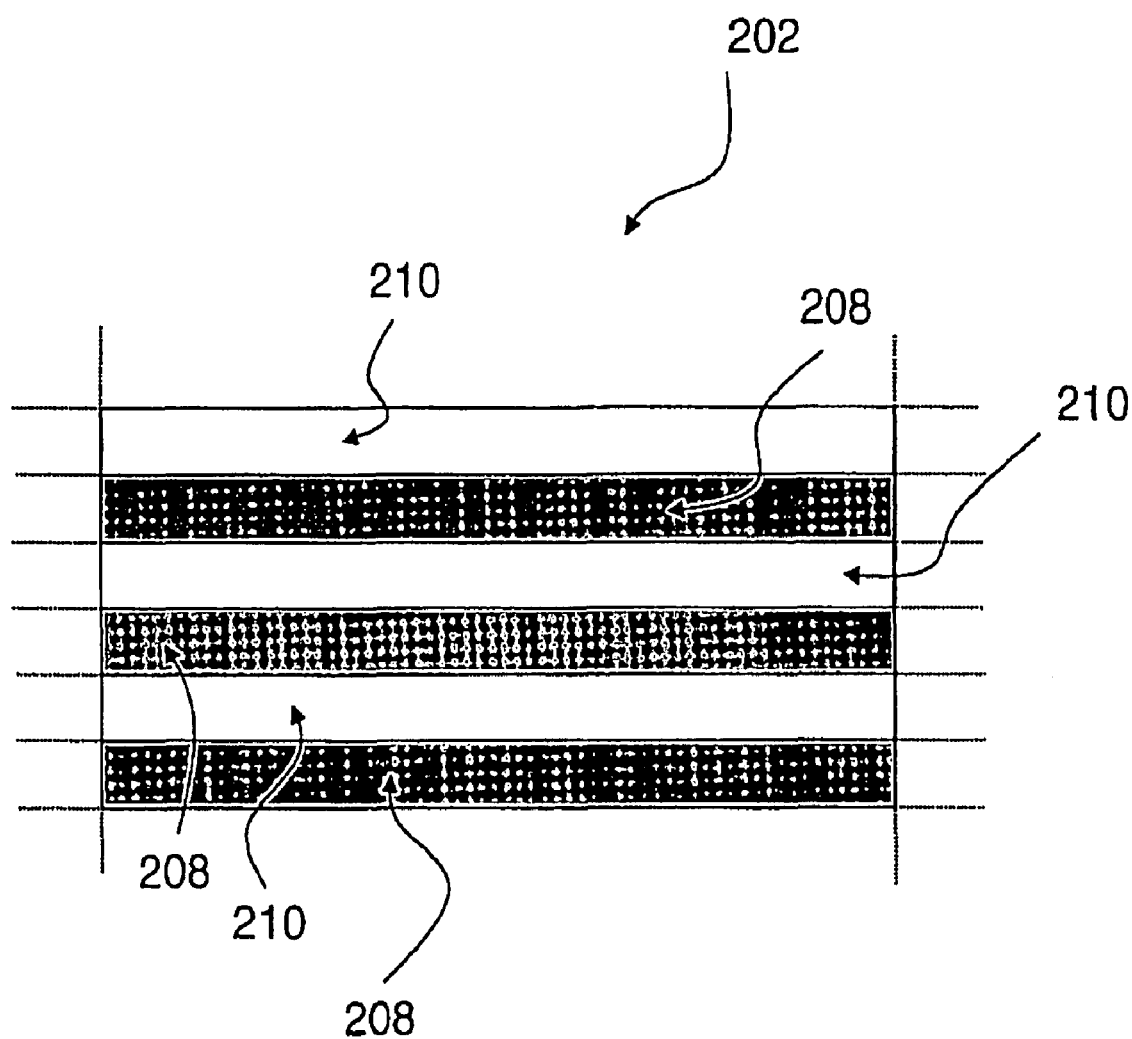
FIG. 5 schematically depicts a cross-section of part of the pellicle shown in FIG. 4.

FIG. 5 schematically depicts a cross-section of part of the pellicle 200 shown in FIG. 4. In FIG. 5, the thickness of the Zr layers 208 is about 1 nm and the thickness of the Si layers 10 is about 3 nm. In alternative embodiments, although not shown, the thickness of the Zr/Si layers 202 may be variable. Although not fully shown on FIG. 5, there may be 5 about 0 or more alternating layers of Zr and Si.

It is noted, that the pellicle 100, 200 may be easily mountable to a lithographic patterning device and may also be easily removed. Additionally, although not shown, the pellicle 100, 200 may be made in a modular form and may therefore form any desirable surface area. For example, may have a surface area of about 12 cm by about 15 cm (i.e., about 12×15 cm$^2$).

Using the pellicle 100, 200 as is described with reference to the foregoing, effective filtering of DUV is obtainable. The pellicle can thus act as a spectral purity filter, having only about 20% light loss with up to about 100×10$^5$ gain in EUV to DUV ratio. In addition, the pellicles 100, 200 may mitigate debris such as atomic particles, micro-particles and ions emitted produced from a suitable radiation source.

Figure 6:
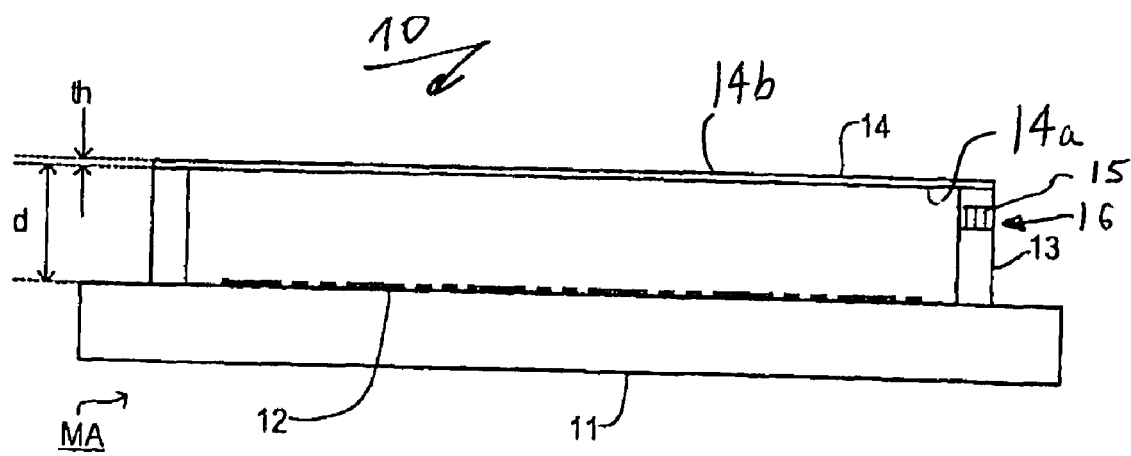
FIG. 6 schematically depicts an assembly according to an embodiment of the invention.

FIG. 6 schematically depicts an assembly 10 according to the invention. In particular a mask MA which may comprise a transparent, for example quartz, substrate 11 on one face of which is provided a chrome pattern 12 representing the pattern which is to be printed on a substrate. A frame 13 surrounds the chrome pattern and supports the pellicle 14 in spaced relation to the mask MA. The pellicle 14 may comprise any embodiment as is discussed with reference to the foregoing. The pellicle 14 is therefore a thin, substantially EUV transparent membrane that is configured to protect the chrome pattern and in particular is configured to prevent dust particles from settling on the chrome pattern. As is discussed with reference to the foregoing, the pellicle 14 may also act as a spectral purity filter and/or mitigate debris propagating from an EUV source in a suitable lithographic apparatus. Therefore, the multi-layered pellicle according to embodiment of the invention provide a synergistic solution for mask protection, debris mitigation, and spectral purity.

Frame 13 is sized so that the pellicle is spaced from the plane of the chrome pattern 12 by a distance d, for example, about 5 mm, so that any dust particle adhering to the pellicle is out of focus during exposure and does not print in the resist on the substrate. The pellicle 14 may have a height of about 6.3±0.3 mm, an outer width of about 122±0.3 mm, an inner width of about 118±0.3 mm, an outer length of about 150±0.3 mm, and an inner length of about 146±0.3 mm. In an embodiment of the assembly, the pellicle comprises a surface 14a facing the patterning device or mask MA and a particle-trapping surface 14b. The particle-trapping surface 14b is located at a distance of the reflective surface of the mask MA. The distance may have a value between about 5 mm and about 7 mm. A venting hole 15 may be incorporated in the frame 13 to allow equalization of pressure between the pellicle 14 and mask MA and outside. The venting hole 15 may comprise a filter 16 to prevent debris from entering the space between the mask MA and the pellicle 14.

Preferably, the pellicle 14 has a total thickness of the multi-layered structure of alternating layers ranging from about 10 nm to about 700 nm. More preferably, the alternating layers forming the multi-layered structure are formed from a combination of any of the following: Zr and Si layers; Zr and $B_4C$ layers; Mo and Si layers; Cr and Sc layers; Mo and C layers; and Nb and Si layers.

The pellicle, as is set forth anywhere in the foregoing, is also applicable for maskless EUV applications. In this case the pellicle is preferably positioned between the illumination module of the lithography apparatus and the spatial light modulator at an off-focus position. In this embodiment the pellicle also serves as a spectral purity filter. Due to the fact that the pellicle in the maskless EUV lithography apparatus is arranged at an off-focus position, any precipitations on a pellicle surface are not imaged into a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of lithography, it will be appreciated that the invention may be used in other applications.

The terms "radiation" and "beam" used herein encompass all types of electromagnetic radiation, including electromagnetic radiation, such as ultraviolet (UV) radiation (e.g. having a wavelength of or about 365, 355, 248, 193, 157 or 126 nm) and especially extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A pellicle for integrated circuit equipment operating in an EUV range, the pellicle comprising a multi-layered structure of alternating layers, the pellicle being constructed and arranged to reflect or absorb undesired radiation, to intercept debris to enhance the spectral purity of a radiation beam, and to protect a patterning device constructed and arranged to pattern a radiation beam comprising EUV radiation, wherein the multi-layered structure comprises between about 20 and about 50 alternating layers of two materials.

2. A pellicle according to claim 1, wherein the pellicle is constructed and arranged to reflect or absorb DUV radiation and transmit EUV radiation simultaneously.

3. A pellicle according to claim 1, wherein the pellicle is configured to transmit at least 80% of the EUV radiation in the radiation beam through the pellicle.

4. A pellicle according to claim 1, wherein the pellicle is configured to transmit the radiation beam such that a ratio of EUV radiation to DUV radiation is enhanced by up to $10^5$ times.

5. A pellicle according to claim 1, wherein the thickness of each of the alternating layers ranges from about 0.5 nm to about 20 nm.

6. A pellicle according to claim 1, wherein the total thickness of the multi-layered structure of alternating layers ranges from about 10 nm to about 700 nm.

7. A pellicle according to claim 1, wherein the alternating layers are formed from a combination of layers selected from the group consisting of: Zr and Si layers, Zr and $B_4C$ layers, Mo and Si layers, Cr and Sc layers, Mo and C layers, and Nb and Si layers.

8. A pellicle according to claim 1, wherein the multi-layered structure of alternating layers has a mesh-like structure embedded therein.

9. A pellicle according to claim 8, wherein the mesh-like structure is in the form of a honeycomb with a plurality of apertures, each aperture having a size of about 1 $mm^2$.

10. A pellicle according to claim 1, wherein the multi-layered structure of alternating layers is supported on one side by a mesh-like structure.

11. A pellicle according to claim 10, wherein the mesh-like structure is in the form of a honeycomb with a plurality of apertures, each aperture having a size of about 1 $mm^2$.

12. A pellicle according to claim 10, wherein the multi-layered structure of alternating layers is supported on both sides by a mesh-like structure.

13. A pellicle according to claim 1, wherein the debris comprises atomic particles, micro-particles, and/or ions.

14. A pellicle according to claim 1, wherein the pellicle is arranged in a modular form having a surface area of about 12 cm by about 15 cm.

15. A pellicle according to claim 1, wherein the EUV range is about 5 nm to about 20 nm.

16. An assembly comprising
a pellicle comprising a multi-layered structure of alternating layers, the pellicle being constructed and arranged to reflect or absorb undesired radiation and to intercept debris to enhance the spectral purity of an EUV radiation beam, wherein the multi-layered structure comprises between about 20 and about 50 alternating layers of two' materials; and
a patterning device constructed and arranged to pattern the EUV radiation beam, wherein the pellicle is constructed and arranged to protect the patterning device.

17. An assembly according to claim 16, wherein the pellicle and the patterning device are attached to each other.

18. An assembly according to claim 16, wherein the pellicle is mounted on the patterning device.

19. An assembly according to claim 18, further comprises a venting hole constructed and arranged to allow equalization of pressure between the pellicle and the patterning device and outside of the assembly.

20. An assembly according to claim 19, wherein the venting hole comprises a filter constructed and arranged to capture debris entering the space between the patterning device and pellicle.

21. An assembly according to claim 16, wherein the pellicle comprises a surface facing the patterning device and a particle-trapping surface, the particle-trapping surface being located at a distance from a reflective surface of the patterning device, the distance being between about 5 mm and about 7 mm.

22. An assembly according to claim 16, wherein the EUV radiation beam has a wavelength between about 5 nm and about 20 nm.

23. A lithographic apparatus for maskless EUV applications, the apparatus comprising:
an illumination system constructed and arranged to condition a radiation beam emanating from a source of radiation and to supply the conditioned radiation beam to a spatial light modulator for patterning the radiation beam;
a substrate table constructed and arranged to hold a substrate;
a projection system constructed and arranged to project the conditioned radiation beam onto a target portion of the substrate; and
a pellicle arranged between the illumination system and the spatial light modulator, the pellicle comprising a multi-layered structure of alternating layers, wherein the multi-layered structure comprises between about 20 and about 50 alternating layers of two materials and wherein the pellicle is constructed and arranged to reflect or absorb undesired radiation and to intercept debris to enhance the spectral purity of the radiation beam.

24. A lithographic apparatus according to claim 23, wherein the pellicle is arranged at an off-focus position of the illumination system.

25. A lithographic apparatus according to claim 23, wherein the radiation beam has a wavelength between about 5 nm and about 20 nm.

26. A lithographic apparatus for EUV applications comprising:
an illumination system constructed and arranged to condition a radiation beam;
a support constructed and arranged to support a patterning device, the patterning device being capable of imparting the radiation beam with a pattern in its cross-section to form a patterned radiation beam, whereby the support is displaceably arranged;
a substrate table constructed and arranged to hold a substrate;
a projection system constructed and arranged to project the patterned radiation beam onto a target portion of the substrate; and
a pellicle comprising a multi-layered structure of alternating layers, wherein the multi-layered structure comprises between about 20 and about 50 alternating layers of two materials, and wherein the pellicle is constructed and arranged to reflect or absorb undesired radiation, to intercept debris to enhance the spectral purity of the radiation beam, and to protect the patterning device.

27. A lithographic apparatus according to claim 26, wherein the radiation beam has a wavelength between about 5 nm and about 20 nm.

28. A device manufacturing method comprising:
intercepting a beam of EUV radiation with a pellicle constructed and arranged to protect a patterning device, the pellicle comprising a multi-layered structure comprising between about 20 and about 50 alternating layers of two materials;
enhancing the spectral purity of the beam of EUV radiation with the pellicle by reflecting or absorbing undesired radiation and intercepting debris;
patterning the beam of EUV radiation with the patterning device; and
projecting the patterned beam of EUV radiation onto a substrate.

29. A device manufacturing method according to claim 28, wherein the beam of EUV radiation has a wavelength between about 5 nm and about 20 nm.

* * * * *